US012660473B2

(12) United States Patent
Li et al.

(10) Patent No.: US 12,660,473 B2
(45) Date of Patent: Jun. 16, 2026

(54) DISPLAY APPARATUS, AND DISPLAY PANEL AND MANUFACTURING METHOD THEREFOR

(71) Applicants:Chengdu BOE Optoelectronics Technology Co., Ltd., Chengdu (CN); BOE Technology Group Co., Ltd., Beijing (CN)

(72) Inventors: Zeliang Li, Beijing (CN); Yanqiang Wang, Beijing (CN); Tao Gao, Beijing (CN); Xiaoqi Ding, Beijing (CN); Guoyi Cui, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 361 days.

(21) Appl. No.: 18/273,556

(22) PCT Filed: Nov. 22, 2021

(86) PCT No.: PCT/CN2021/131993
§ 371 (c)(1),
(2) Date: Jul. 21, 2023

(87) PCT Pub. No.: WO2022/247174
PCT Pub. Date: Dec. 1, 2022

(65) Prior Publication Data
US 2024/0306468 A1 Sep. 12, 2024

(30) Foreign Application Priority Data

May 25, 2021 (CN) .......................... 202110574208.4

(51) Int. Cl.
*H10K 59/65* (2023.01)
*H10K 59/12* (2023.01)
(Continued)

(52) U.S. Cl.
CPC ......... *H10K 59/65* (2023.02); *H10K 59/1201* (2023.02); *H10K 59/122* (2023.02); *H10K 59/879* (2023.02)

(58) Field of Classification Search
CPC ...... H04N 23/57; H10K 59/12; H10K 59/122; H10K 59/1201; H10K 59/124;
(Continued)

(56) References Cited

U.S. PATENT DOCUMENTS

2012/0319978 A1 12/2012 Takeuchi

FOREIGN PATENT DOCUMENTS

| CN | 106526944 A | 3/2017 |
| CN | 110808271 A | 2/2020 |

(Continued)

OTHER PUBLICATIONS

International Search Report and Written Opinion mailed on Feb. 23, 2022, in corresponding PCT/CN2021/131993, 6 pages.

*Primary Examiner* — Fazli Erdem
(74) *Attorney, Agent, or Firm* — XSENSUS LLP

(57) ABSTRACT

A display panel, including: a driving backplane, provided with a pixel region and a light-transmitting region, the light-transmitting region being provided with a plurality of light-converging structures; and a light-emitting layer, provided on a side of the driving backplane and covering the pixel region and the light-transmitting region, the light-emitting layer comprising a plurality of light-emitting devices, and a light-emitting device being located within the pixel region; wherein a light-converging structure is used to enable light entering the light-transmitting region through (Continued)

the light-emitting layer to be converged and emitted towards a side of the light-transmitting region away from the light-emitting layer.

17 Claims, 5 Drawing Sheets

(51) Int. Cl.
H10K 59/122 (2023.01)
H10K 59/80 (2023.01)

(58) Field of Classification Search
CPC .... H10K 59/65; H10K 59/879; H10K 50/856; H10K 50/858
USPC .......................................................... 257/40
See application file for complete search history.

(56) References Cited

FOREIGN PATENT DOCUMENTS

| | | |
|---|---|---|
| CN | 113517326 A | 10/2021 |
| EP | 2527913 A1 | 11/2012 |

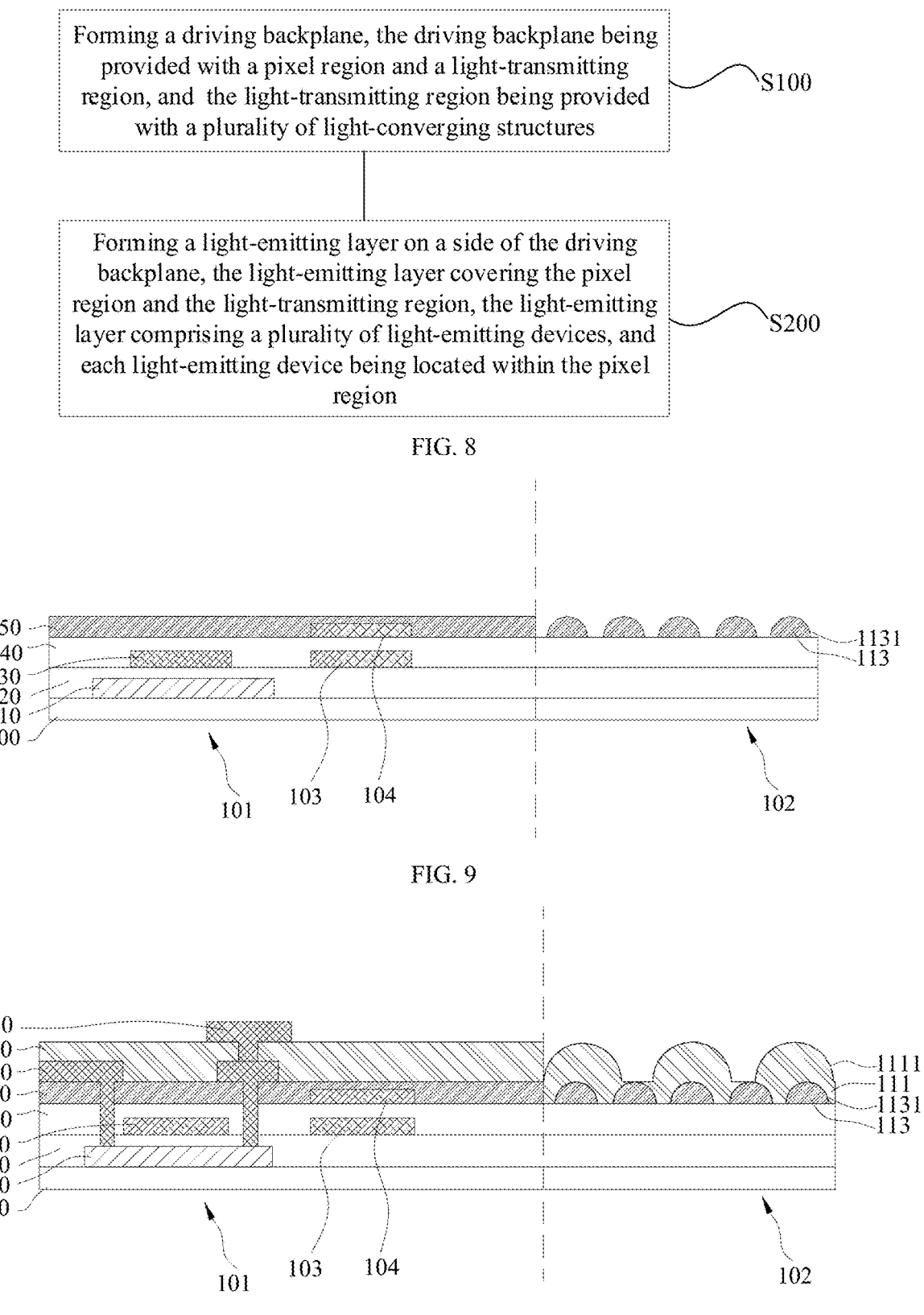

Forming a driving backplane, the driving backplane being provided with a pixel region and a light-transmitting region, and the light-transmitting region being provided with a plurality of light-converging structures ~ S100

Forming a light-emitting layer on a side of the driving backplane, the light-emitting layer covering the pixel region and the light-transmitting region, the light-emitting layer comprising a plurality of light-emitting devices, and each light-emitting device being located within the pixel region ~ S200

DISPLAY APPARATUS, AND DISPLAY PANEL AND MANUFACTURING METHOD THEREFOR

CROSS-REFERENCE TO RELATED APPLICATIONS

The present disclosure is based upon International Application No. PCT/CN2021/131993, filed on Nov. 22, 2021, which claims priority to Chinese patent applications NO. 202110574208.4 entitled "Display apparatus, display panel and manufacturing method therefor", filed on May 25, 2021, and the entire contents of each are incorporated herein by reference.

TECHNICAL FIELD

The present disclosure relates to the field of display technology, and particularly, to a display terminal, a display apparatus, a display panel and a manufacturing method therefor.

BACKGROUND

At present, in most under-screen camera technologies for a full screen, the amount of light that can be received by the under-screen camera apparatus is increased by reducing the PPI (Pixels Per Inch, pixel density) of the camera region and increasing the light-transmitting area between the pixels. However, in this method, the range of light acceptable by the camera apparatus is smaller, and the imaging effect is poor.

It should be noted that the information disclosed in the above background part is only used to enhance the understanding of the background of the present disclosure, and therefore may include information that does not constitute the related art known to those of ordinary skill in the art.

SUMMARY

The objective of the present disclosure is to overcome the defects in the related art, and provide a display apparatus, a display panel and a manufacturing method therefor. The display panel is provided with a light-converging structure in the light-transmitting region of the driving backplane, which is conducive to converge light irradiated on the light-transmitting region, expand the range of light that can be received by the light-transmitting region, and improve the imaging quality of the under-screen camera technology.

In order to achieve the above invention objective, the present disclosure adopts the following technical solutions.

According to a first aspect of the present disclosure, there is provided a display panel, including:

a driving backplane, provided with a pixel region and a light-transmitting region, the light-transmitting region being provided with a plurality of light-converging structures; and a light-emitting layer, provided on a side of the driving backplane and covering the pixel region and the light-transmitting region, the light-emitting layer including a plurality of light-emitting devices, and a light-emitting device being located within the pixel region;

where a light-converging structure is used to enable light entering the light-transmitting region through the light-emitting layer to be converged and emitted towards a side of the light-transmitting region away from the light-emitting layer.

In at least one embodiment of the present disclosure, the light-transmitting region is provided with at least one light-converging layer, and the light-converging structure is an arc surface protrusion formed on a light-converging layer.

In at least one embodiment of the present disclosure, the driving backplane includes:

a substrate;

an active layer, provided on a side of the substrate and located in the pixel region;

a first gate insulation layer, covering the active layer and the substrate;

a gate layer, provided on a side of the first gate insulation layer away from the substrate, and provided directly opposite to the active layer;

a second gate insulation layer, covering the gate layer and the first gate insulation layer;

an interlayer dielectric layer, covering the second gate insulation layer;

a first source/drain layer, provided on a side of the interlayer dielectric layer away from the substrate, the first source/drain layer being connected to the active layer;

a first planarization layer, covering the first source/drain layer and the interlayer dielectric layer;

a second source/drain layer, provided on a side of the first planarization layer away from the substrate, the second source/drain layer being connected to the first source/drain layer; and a second planarization layer, covering the second source/drain layer and the first planarization layer;

where the light-emitting layer is provided on a surface of the second planarization layer away from the substrate;

where, a region of at least one film layer of the first gate insulation layer, the second gate insulation layer, the interlayer dielectric layer, the first planarization layer, and the second planarization layer, located in the light-transmitting region is the light-converging layer.

In at least one embodiment of the present disclosure, the light-emitting layer includes:

a first electrode, provided on a surface of the second planarization layer away from the substrate;

a pixel definition layer, provided on a surface of the second planarization layer away from the substrate and exposing the first electrode;

a light-emitting function layer, at least covering a surface region of the first electrode away from the substrate and exposed by the pixel definition layer; and a second electrode, covering the light-emitting function layer.

In at least one embodiment of the present disclosure, the light-converging layer includes a first light-converging layer and a second light-converging layer distributed towards a direction away from the substrate;

the light-converging structure includes a first light-converging structure and a second light-converging structure;

an arc surface protrusion of the first light-converging layer is the first light-converging structure, and an arc surface protrusion of the second light-converging layer is the second light-converging structure; and an orthographic projection of a part of the first light-converging structure on the substrate does not coincide with an orthographic projection of the second light-converging structure on the substrate.

In at least one embodiment of the present disclosure, a region of the second planarization layer located in the light-transmitting region is the second light-converging layer, a region of the first planarization layer located in the light-transmitting region is the first light-converging layer, a refractive index of the pixel definition layer is less than a refractive index of the second planarization layer, and the refractive index of the second planarization layer is less than a refractive index of the first planarization layer.

In at least one embodiment of the present disclosure, the refractive index of the pixel definition layer is 1.0 to 1.4, the refractive index of the second planarization layer is 1.5 to 1.9, and the refractive index of the first planarization layer is 2.0 to 2.4.

In at least one embodiment of the present disclosure, a thickness of the second planarization layer is greater than a thickness of the first planarization layer, and a curvature radius of the second light-converging structure is greater than or equal to a curvature radius of the first light-converging structure.

In at least one embodiment of the present disclosure, the light-converging layer further includes a third light-converging layer;

the light-converging structure further includes a third light-converging structure, and an arc surface protrusion of the third light-converging layer is the third light-converging structure; and a region of the interlayer dielectric layer located in the light-transmitting region is the third light-converging layer, and the refractive index of the first planarization layer is less than a refractive index of the interlayer dielectric layer.

In at least one embodiment of the present disclosure, the refractive index of the interlayer dielectric layer is less than or equal to a refractive index of the second gate insulation layer, and the refractive index of the second gate insulation layer is less than or equal to a refractive index of the first gate insulation layer.

In at least one embodiment of the present disclosure, an orthographic projection of a part of the third light-converging structure on the substrate does not coincide with an orthographic projection of the first light-converging structure on the substrate.

In at least one embodiment of the present disclosure, a thickness of the second planarization layer is greater than a thickness of the first planarization layer, and the thickness of the first planarization layer is greater than a thickness of the interlayer dielectric layer; a curvature radius of the second light-converging structure is greater than or equal to a curvature radius of the first light-converging structure, and the curvature radius of the first light-converging structure is greater than or equal to a curvature radius of the third light-converging structure.

In at least one embodiment of the present disclosure, a curvature radius of the second light-converging structure is 4.0 to 6.0 μm, a curvature radius of the first light-converging structure is 2.0 to 3.0 μm, and a curvature radius of the third light-converging structure is 1.0 to 1.5 μm.

In at least one embodiment of the present disclosure, a number of the light-converging layer is more than one, and a plurality of light-converging layers are arranged and distributed towards a direction away from the substrate; and in two adjacent light-converging layers, an arc surface protrusion of a light-converging layer away from the substrate covers a plurality of arc surface protrusions of a light-converging layer close to the substrate.

In at least one embodiment of the present disclosure, the light-converging layer includes a first light-converging layer and a second light-converging layer distributed towards a direction away from the substrate;

the light-converging structure includes a first light-converging structure and a second light-converging structure;

an arc surface protrusion of the first light-converging layer is the first light-converging structure, and an arc surface protrusion of the second light-converging layer is the second light-converging structure; and an orthographic projection of the second light-converging structure on the substrate completely covers an orthographic projection of the first light-converging structure on the substrate.

In at least one embodiment of the present disclosure, the light-converging layer further includes a third light-converging layer, and the third light-converging layer is located on a side of the first light-converging layer close to the substrate;

the light-converging structure further includes a third light-converging structure;

an arc surface protrusion of the third light-converging layer is the third light-converging structure; and the orthographic projection of the first light-converging structure on the substrate completely covers an orthographic projection of the third light-converging structure on the substrate.

In at least one embodiment of the present disclosure, a cross section of the arc surface protrusion in a thickness direction of the driving backplane is an arc, and an included angle between a tangent line of a lowest point of the arc and a connection line between the lowest point and another lowest point of the arc is not less than 45°.

In at least one embodiment of the present disclosure, a surface of the arc surface protrusion is a spherical crown.

According to a second aspect of the present disclosure, there is provided a method for manufacturing a display panel, including:

forming a driving backplane, the driving backplane being provided with a pixel region and a light-transmitting region, and the light-transmitting region being provided with a plurality of light-converging structures;

forming a light-emitting layer on a side of the driving backplane, the light-emitting layer covering the pixel region and the light-transmitting region, the light-emitting layer including a plurality of light-emitting devices, and each light-emitting device being located within the pixel region;

where a light-converging structure is used to enable light entering the light-transmitting region through the light-emitting layer to be converged and emitted towards a side of the light-transmitting region away from the light-emitting layer.

In at least one embodiment of the present disclosure, the light-transmitting region is provided with at least one light-converging layer, an arc surface protrusion is formed on a light-converging layer, and the light-converging structure is the arc surface protrusion.

In at least one embodiment of the present disclosure, forming the driving backplane includes:

providing a substrate;

forming an active layer on a side of the substrate, the active layer being located within the pixel region;

forming a first gate insulation layer on a side of the active layer away from the substrate, the first gate insulation layer covering the active layer and the substrate;

forming a gate layer on a side of the first gate insulation layer away from the substrate, the gate layer being provided directly opposite to the active layer;

forming a second gate insulation layer on a side of the gate layer away from the substrate, the second gate insulation layer covering the gate layer and the first gate insulation layer;

forming an interlayer dielectric layer on a side of the second gate insulation layer away from the substrate, the interlayer dielectric layer covering the second gate insulation layer;

forming a first source/drain layer on a side of the interlayer dielectric layer away from the substrate, the first source/drain layer being connected to the active layer;

forming a first planarization layer on a side of the first source/drain layer away from the substrate, the first planarization layer covering the first source/drain layer and the interlayer dielectric layer;

forming a second source/drain layer on a side of the first planarization layer away from the substrate, the second source/drain layer being connected to the first source/drain layer; and forming a second planarization layer on a side of the second source/drain layer away from the substrate, the second planarization layer covering the second source/drain layer and the first planarization layer;

where, a region of at least one film layer of the first gate insulation layer, the second gate insulation layer, the interlayer dielectric layer, the first planarization layer, and the second planarization layer, located in the light-transmitting region is the light-converging layer.

According to a third aspect of the present disclosure, there is provided a display apparatus, including a display panel described in the first aspect.

According to a fourth aspect of the present disclosure, there is provided a terminal device, including:

a display apparatus according to the third aspect;

a camera apparatus, provided on a side of the driving backplane away from the light-emitting layer and opposite to the light-transmitting region.

The display panel provided by the present disclosure includes a driving backplane and a light-emitting layer. The display panel may be used for various display terminal devices, where a camera apparatus may be provided on a side of the driving backplane away from the light-emitting layer, and position of the camera apparatus is opposite to position of a light-transmitting region of the driving backplane. The light may enter the camera apparatus through the light-emitting layer and the light-transmitting region of the driving backplane. The driving backplane includes a pixel region and a light-transmitting region, the light-transmitting region is provided with a light-converging structure, and the light-converging structure is used to enable light entering the light-transmitting region through the light-emitting layer to be converged and emitted towards a side of the light-transmitting region away from the light-emitting layer. In the present disclosure, a light-converging structure is provided in the light-transmitting region of the driving backplane, which is conducive to converge light irradiated on the light-transmitting region, expand the range of light that can be received by the light-transmitting region, and improve the imaging quality of the under-screen camera technology.

It should be understood that the above general description and the following detailed description are exemplary and explanatory only and are not intended to limit the present disclosure.

BRIEF DESCRIPTION OF THE DRAWINGS

The accompanying drawings, which are incorporated in and constitute a part of the description, illustrate embodiments consistent with the present disclosure and together with the description serve to explain the principles of the disclosure. Obviously, the drawings in the following description are some embodiments of the present disclosure, and for those of ordinary skill in the art, other drawings can also be obtained from these drawings without creative efforts.

Figure 1:
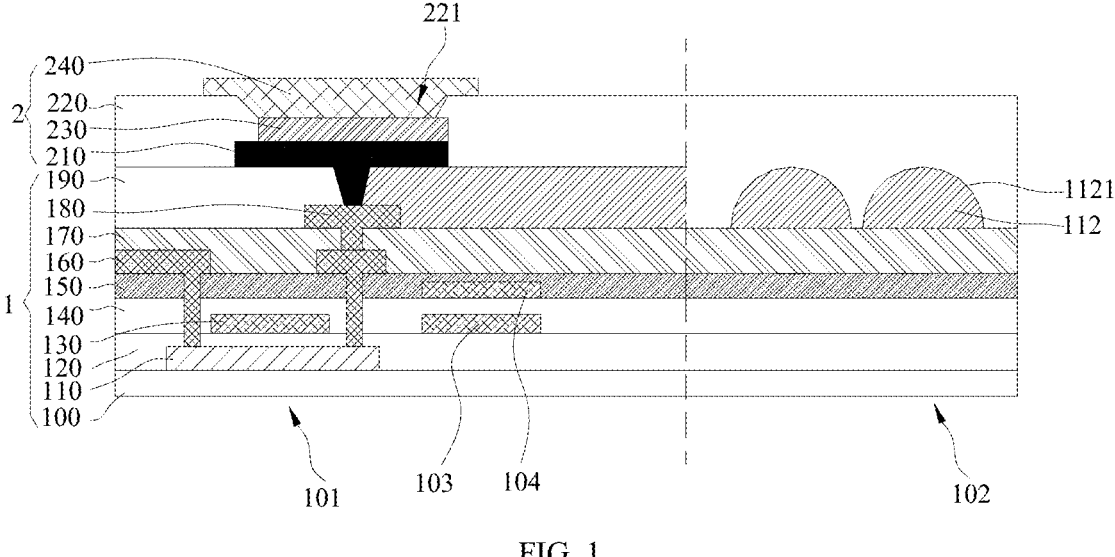
Figure 2:
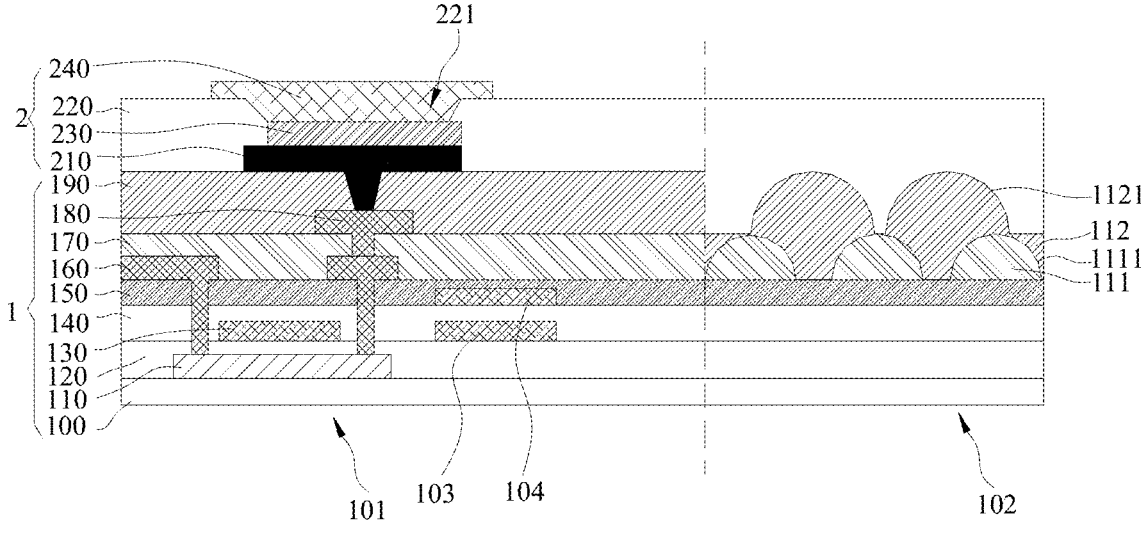
Figure 3:
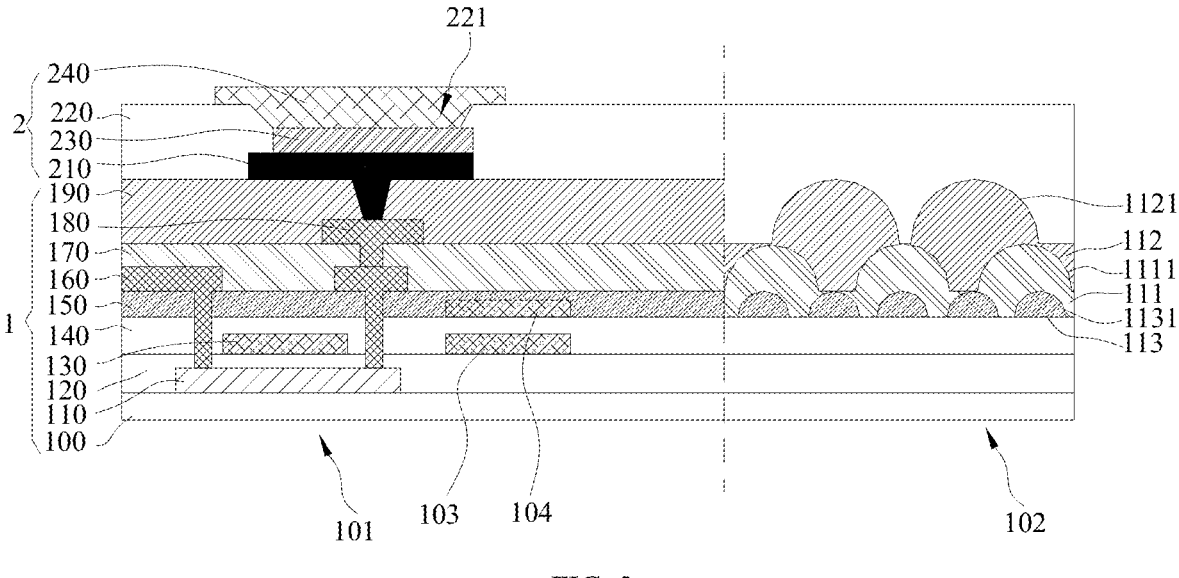
Figure 4:
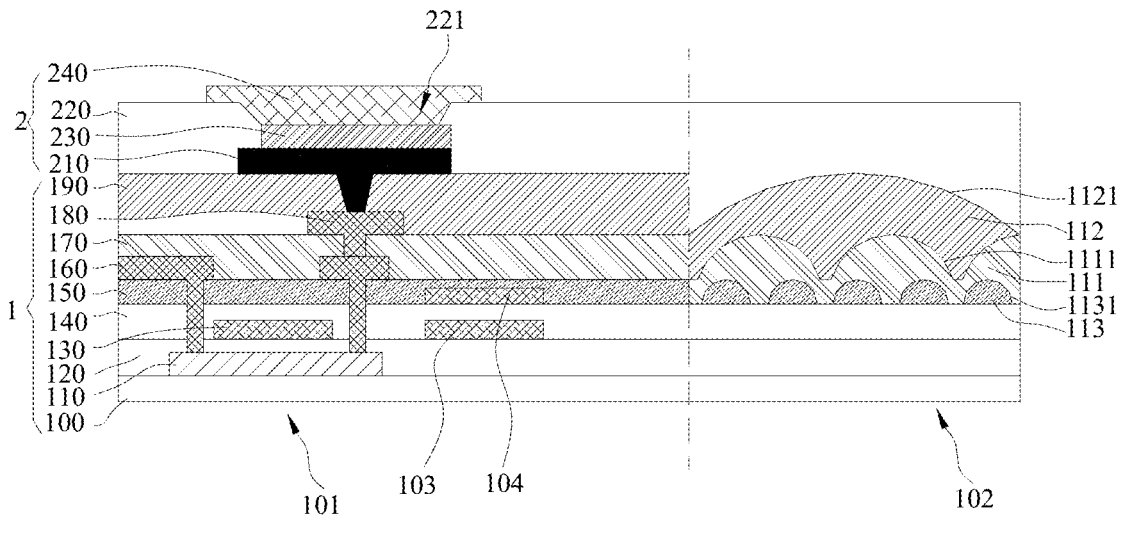
Figure 5:
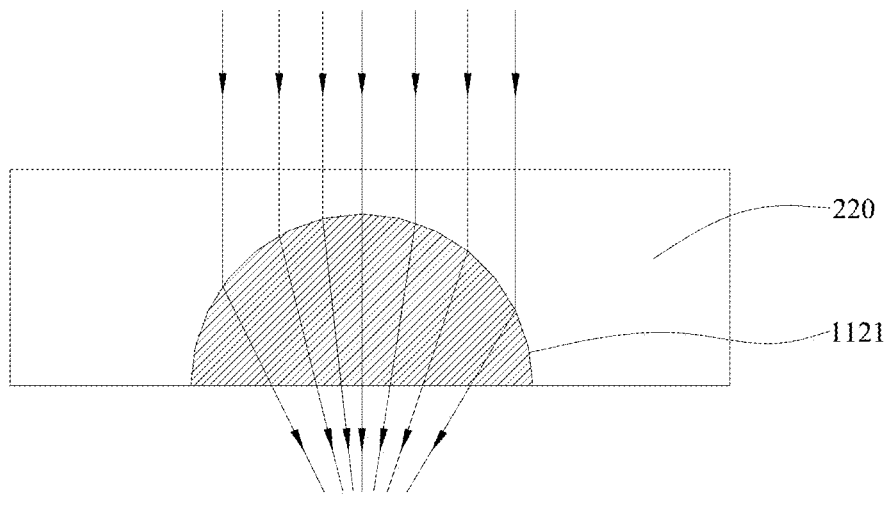
Figure 6:
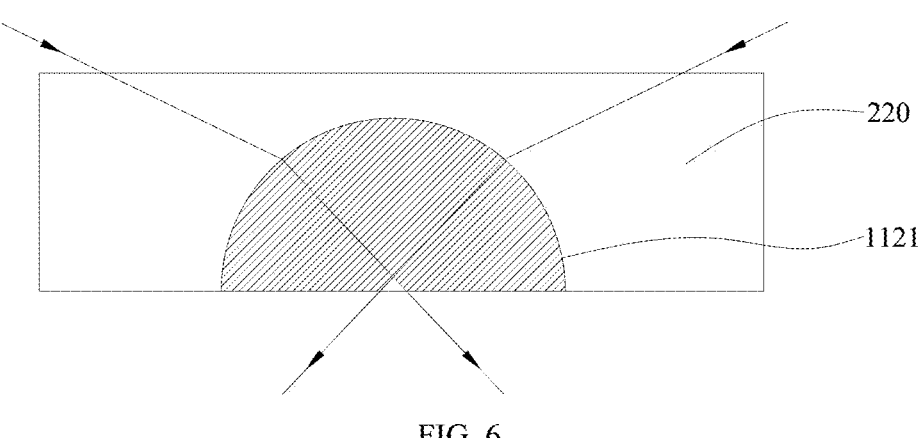
Figure 7:
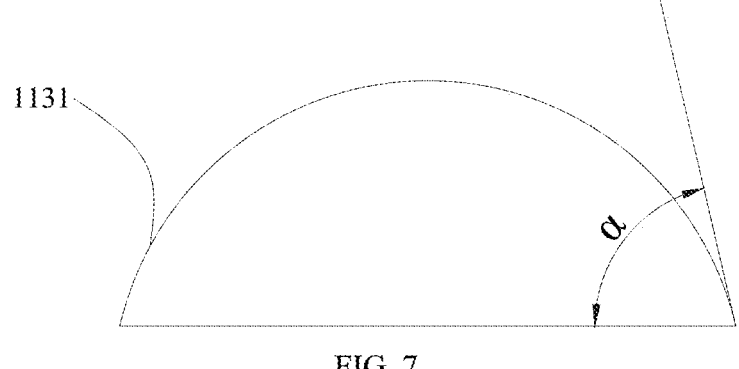
Figure 11:
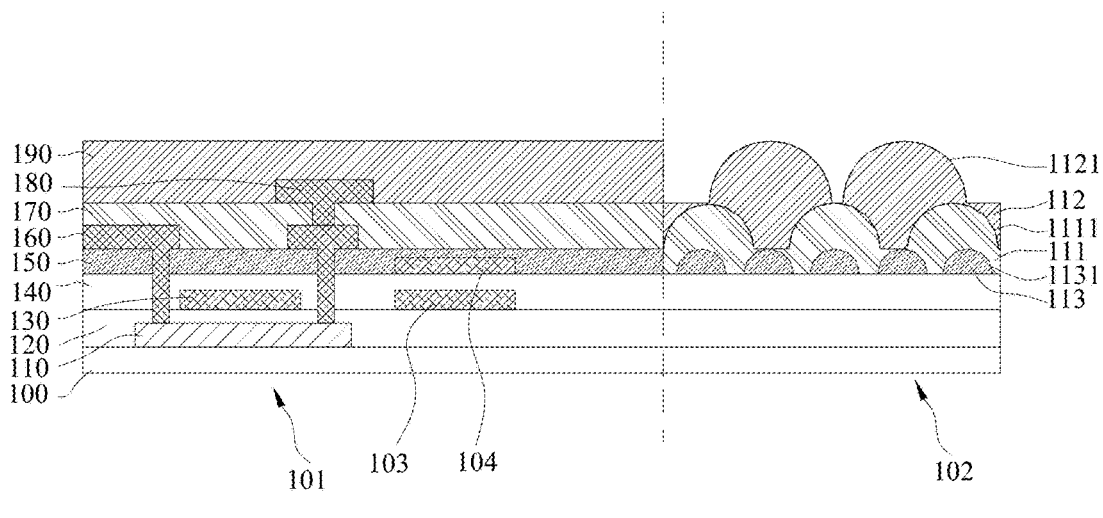
Figure 12:
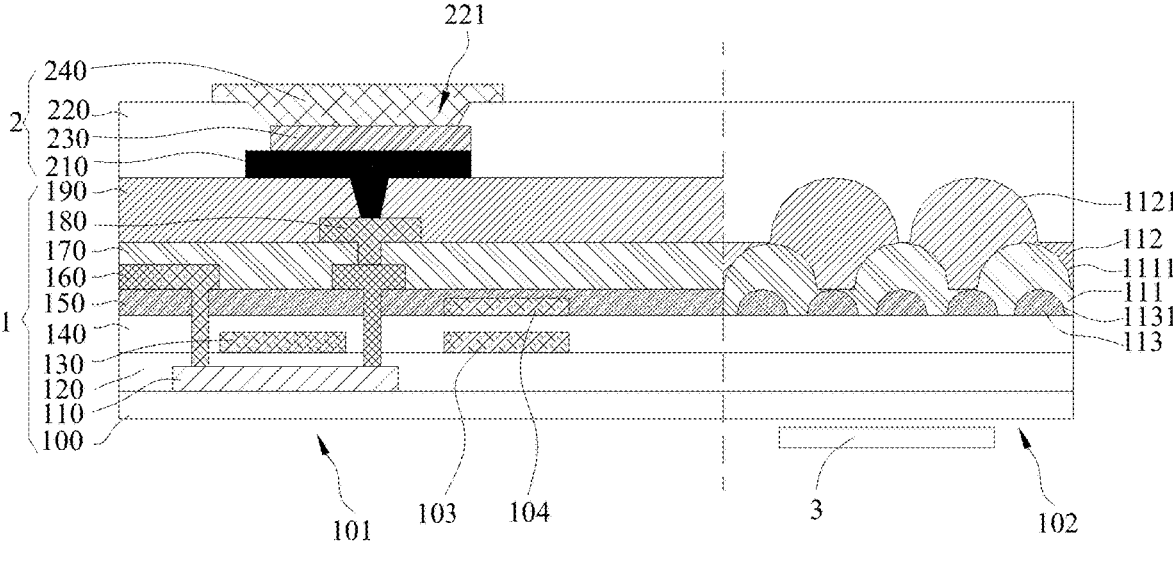

FIG. 1 is a schematic structural diagram of a display panel according to some embodiments of the present disclosure;

FIG. 2 is a schematic structural diagram of a display panel according to some embodiments of the present disclosure;

FIG. 3 is a schematic structural diagram of a display panel according to some embodiments of the present disclosure;

FIG. 4 is a schematic structural diagram of a display panel according to some embodiments of the present disclosure;

FIG. 5 is a schematic diagram of a light-converging structure according to some embodiments of the present disclosure;

FIG. 6 is a schematic diagram of refraction and light converging of a light-converging structure according to some embodiments of the present disclosure;

FIG. 7 is a sectional view of a light-converging structure according to some embodiments of the present disclosure;

FIG. 8 is a flowchart of a method for manufacturing a display panel according to some embodiments of the present disclosure;

FIG. 9 is a schematic structural diagram of forming a third light-converging structure according to some embodiments of the present disclosure;

FIG. 10 is a schematic structural diagram of forming a first light-converging structure according to some embodiments of the present disclosure;

FIG. 11 is a schematic structural diagram of forming a second light-converging structure according to some embodiments of the present disclosure;

FIG. 12 is a schematic structural diagram of a terminal device according to some embodiments of the present disclosure.

The reference numerals of the main elements in the drawings are illustrated as follows.

1—Driving backplane; 101—Pixel region; 102—Light-transmitting region; 100—Substrate; 110—Active layer; 120—First gate insulation layer; 130—Gate layer; 140—Second gate insulation layer; 150—Interlayer dielectric layer; 160—First source/drain layer; 170—First planarization layer; 180—Second source/drain layer; 190—Second planarization layer; 111—First light-converging layer; 1111—First light-converging structure; 112—Second light-converging layer; 1121—Second light-converging structure; 113—Third light-converging layer; 1131—Third light-converging structure; 103—First pole; 104—Second pole; 2—Light-emitting layer; 210—First electrode; 220—Pixel definition layer; 221—Opening; 230—Light-emitting function layer; 240—Second electrode; 3—Camera apparatus.

DETAILED DESCRIPTION

Example embodiments will now be described more fully with reference to the accompanying drawings. Example embodiments, however, can be implemented in various forms and should not be construed as limited to the embodiments set forth here; by contrast, these embodiments are provided so that the present disclosure will be thorough and complete, and will fully convey the concept of example embodiments to those skilled in the art. The same reference numerals in the drawings denote the same or similar structures, and thus their detailed descriptions will be omitted. In addition, the drawings are merely schematic illustrations of the present disclosure, and are not necessarily drawn to scale.

Although relative terms such as "upper" and "lower" are used in the description to describe the relative relationship of one component to another component shown in the drawings, these terms are used in the description only for convenience, for example, according to the directions shown in the accompanying drawings. It will be appreciated that if the apparatus shown in the drawings is turned over so that it is upside down, then the component described as being "upper" will become the component that are "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "comprising" and "including" are used to indicate an open inclusion and mean that there may be additional elements/components/etc., in addition to the listed elements/components/etc.; the terms "first", "second" and "third" etc., are only used as a marker, not a limit on the number of its objects.

In the related art, in the under-screen camera technology for the full screen, the amount of light that can be received by the under-screen camera apparatus is increased by reducing the PPI (Pixels Per Inch, pixel density) of the camera region and increasing the light-transmitting area between the pixels. However, the display region of display panel and the PPI of the camera region cannot differ too much normally, otherwise, it may cause significant differences in display brightness and poor display effect. Therefore, in the related art, the light-transmitting area of the camera region is not so large, and correspondingly, the amount of light that can be received by the under-screen camera apparatus is smaller, resulting in a poor imaging effect of the camera apparatus.

As shown in FIG. 1 to FIG. 4, the present disclosure provides a display panel, including a driving backplane 1 and a light-emitting layer 2. The driving backplane 1 is provided with a pixel region 101 and a light-transmitting region 102, and the light-transmitting region 102 is provided with a plurality of light-converging structures. The light-emitting layer 2 is provided on a side of the driving backplane 1 and covers the pixel region 101 and the light-transmitting region 102, the light-emitting layer 2 includes a plurality of light-emitting devices, and each light-emitting device is located within the pixel region 101. Among them, the light-converging structure is configured to enable light entering the light-transmitting region 102 through the light-emitting layer 2 to be converged and emitted towards a side of the light-transmitting region 102 away from the light-emitting layer 2.

The display panel provided by the present disclosure includes a driving backplane 1 and a light-emitting layer 2. The display panel may be used for various display terminal devices. Among them, a camera apparatus may be provided on a side of the driving backplane 1 away from the light-emitting layer 2, and position of the camera apparatus is opposite to position of the light-transmitting region 102 of the driving backplane 1. The light may pass through the light-emitting layer 2 and the light-transmitting region 102 of the driving backplane 1 to enter the camera apparatus.

According to the display panel provided by the present disclosure, the driving backplane 1 includes a pixel region 101 and a light-transmitting region 102. The light-transmitting region 102 is provided with a light-converging structure, and the light-converging structure is used to enable light entering the light-transmitting region 102 through the light-emitting layer 2 to be converged and emitted towards a side of the light-transmitting region 102 away from the light-emitting layer 2. In the present disclosure, the light-converging structure is provided in the light-transmitting region 102 of the driving backplane 1, which is conducive to converge light irradiated on the light-transmitting region 102, expand the range of light that can be received by the light-transmitting region 102, and improve the imaging quality of the under-screen camera technology.

The components of the display panel provided in the embodiments of the present disclosure will be described in detail below with reference to the accompanying drawings.

As shown in FIG. 1, the present disclosure provides a display panel, which may be an organic light-emitting diode (OLED) display panel. The display panel includes a driving backplane 1 and a light-emitting layer 2. The driving backplane 1 is provided with a driving circuit, the light-emitting layer 2 includes a plurality of light-emitting devices, and each light-emitting device of the light-emitting layer 2 can be driven by the driving circuit to emit light. In some embodiments, the driving backplane 1 includes a pixel region 101, and the driving circuit includes a pixel circuit. The pixel circuit is provided in the pixel region 101, and may be a pixel circuit such as 7T1C, 7T2C, 6T1C, or 6T2C, as long as it can drive the light-emitting device to emit light, the structure of which is not specifically defined here. The number of the pixel circuits is the same as the number of the light-emitting devices. The pixel circuit is connected to the light-emitting device in a one-to-one correspondence manner, so as to respectively control the light-emitting device to emit light. Among them, nTmC represents a pixel circuit including n transistors (represented by letter "T") and m capacitors (represented by letter "C").

In some embodiments, the driving backplane 1 is formed by a plurality of film layers, and the driving backplane 1 includes a substrate 100 and a driving layer provided on a side of the substrate 100.

The substrate 100 may be a substrate of an inorganic material, or may be a substrate of an organic material. For example, in an embodiment of the present disclosure, the material of the substrate 100 may be a glass material such as soda-lime glass, quartz glass, and sapphire glass, or may be a metal material such as stainless steel, aluminum, and nickel. In another embodiment of the present disclosure, the material of the substrate 100 may be polymethyl methacrylate (PMMA), polyvinyl alcohol (PVA), polyvinyl phenol (PVP) polyether sulfone (PES), polyimide, polyamide, polyacetal, poly carbonate (PC), polyethylene terephthalate (PET), polyethylene naphthalate (PEN), or a combination of them. The substrate 100 may also be a flexible substrate. For example, in an embodiment of the present disclosure, the material of the substrate 100 may be polyimide (PI). The substrate 100 may also be a composite of a plurality of layers of materials. For example, in an embodiment of the present disclosure, the substrate 100 may include a bottom film layer, a pressure-sensitive adhesive layer, a first polyimide layer, and a second polyimide layer stacked in sequence.

The driving circuit may be located on the driving layer. Taking the transistor in the driving circuit being a top gate thin film transistor as an example, the driving layer may include an active layer 110, a first gate insulation layer 120, a gate layer 130, a second gate insulation layer 140, an interlayer dielectric layer 150, a first source/drain layer 160, a first planarization layer 170, a second source/drain layer 180, and a second planarization layer 190. In some embodiments, the active layer 110 is provided on a side of the substrate 100 and located in the pixel region 101. The active layer 110 can be made of IGZO (indium gallium zinc oxide). The first gate insulation layer 120 covers the active layer 110 and the substrate 100, and the first gate insulation layer 120 may be a single film layer such as silicon nitride, silicon oxide, aluminum oxide, or a multi-film layer formed by combination of the single film layers. The gate layer 130 is provided on a side of the first gate insulation layer 120 away from the substrate 100, and is provided directly opposite to the active layer 110. The gate layer 130 includes a gate. The gate may be made of metal materials such as aluminum, copper, or molybdenum. The second gate insulation layer 140 covers the gate layer 130 and the first gate insulation layer 120. The second gate insulation layer 140 may be a single film layer such as silicon nitride, silicon oxide, aluminum oxide, or a multi-film layer formed by combination of the single film layers. The interlayer dielectric layer 150 covers the second gate insulation layer 140, and may be a single film layer such as silicon nitride, silicon oxide, aluminum oxide, and an organic photosensitive material, or a multi-film layer formed by combination of the single film layers. The first source/drain layer 160 is provided on a side of the interlayer dielectric layer 150 away from the substrate 100, and the first source/drain layer 160 is connected to the active layer 110. The first source/drain layer 160 includes a source and a drain. The source and the drain are connected to the active layer 110 through the interlayer dielectric layer 150, the second gate insulation layer 140 and the first gate insulation layer 120. The first planarization layer 170 covers the first source/drain layer 160 and the interlayer dielectric layer 150, and the first planarization layer 170 may be made of an organic photosensitive material or the like. The second source/drain layer 180 is provided on a side of the first planarization layer 170 away from the substrate 100, and the second source/drain layer 180 is connected to the first source/drain layer 160. The second planarization layer 190 covers the second source/drain layer 180 and the first planarization layer 170. The second planarization layer 190 may be made of an organic photosensitive material or the like.

The driving circuit further includes a capacitor. The capacitor includes a first pole 103 and a second pole 104. The first pole 103 is provided on the same layer as the gate layer 130, and the second pole 104 is provided on a side of the second gate insulation layer 140 away from the substrate 100. The second pole 104 is provided opposite to the first pole 103, and the interlayer dielectric layer 150 covers the second pole 104.

The light-emitting layer 2 is provided on a surface of the second planarization layer 190 away from the substrate 100. The light-emitting layer 2 includes a plurality of light-emitting devices distributed in an array in the pixel region 101 and a pixel definition layer 220. Among them, the pixel definition layer 220 is provided on a side of the driving backplane 1, for example, the pixel definition layer 220 is provided on a surface of the second planarization layer 190 away from the substrate 100. The pixel definition layer 220 is used to separate each light-emitting device. In some embodiments, the pixel definition layer 220 may be provided with a plurality of openings 221, and the range defined by each opening 221 is the range of a light-emitting device.

The light-emitting devices may be connected to the pixel circuits in a one-to-one correspondence manner, so as to emit light under the driving of the driving circuit. For example, the light-emitting device may be connected to the second source/drain layer 180, and may emit light under the driving of the driving circuit. Taking the light-emitting device being an OLED light-emitting device as an example, the light-emitting device may include a first electrode 210, a light-emitting function layer 230, and a second electrode 240 that are sequentially stacked in a direction away from the driving backplane 1.

The first electrode 210 is provided on a surface of the second planarization layer 190 away from the substrate 100. The first electrode 210 may be a single-layer or multi-layer structure, and its material may include one or more of a conductive metal, a metal oxide, and an alloy.

The pixel definition layer 220 is provided on a surface of the second planarization layer 190 away from the substrate 100, and exposes the first electrode 210. Each opening 221 of the pixel definition layer 220 exposes each first electrode 210 in a one-to-one correspondence manner, and each opening 221 is not larger than the exposed first electrode 210, that is, the range of any opening 221 is located within the boundary of the corresponding first electrode 210.

The light-emitting function layer 230 at least covers a surface region of the first electrode 210 away from the substrate 100 and exposed by the pixel definition layer 220, and may include a hole injection layer, a hole transport layer, a light-emitting material layer, an electron transport layer, and an electron injection layer sequentially stacked in a direction away from the driving backplane 1. Visible light can be generated by combining holes and electrons in the light-emitting material layer to form excitons that emit photons. The specific light-emitting principle is not described in detail here.

Furthermore, the light-emitting function layers 230 of each light-emitting device may be independent of each other and distributed in an array within each opening 221, that is, the light-emitting function layers 230 of different light-emitting devices are independent of each other.

In some embodiments, the light-emitting function layer 230 of each light-emitting device may also share at least a portion of the film layer of the light-emitting function layer 230, thus reducing the process difficulty. For example, in some embodiments of the present disclosure, each light-emitting device may share at least one of a hole injection layer, a hole transport layer, an electron transport layer, and an electron injection layer. There are a plurality of light-emitting material layers, and the light-emitting material layers are provided in each opening 221 in a one-to-one correspondence manner. In the present embodiment, colors of light emitted by the light-emitting devices can be a same color. At this time, it is needed to cooperate with the light-filtering function of the color film layer to achieve color display. Since the light-emitting material layers of the light-emitting devices are independent of each other, different light-emitting devices can directly emit light of different colors.

The second electrode 240 covers the light-emitting function layer 230, and may be used as the cathode of the light-emitting device. The second electrode 240 may be a single-layer or multi-layer structure, and its material may include one or more of a conductive metal, a metal oxide, and an alloy.

Furthermore, each light-emitting device may share a same second electrode 240. In some embodiments, the second electrode 240 is a continuous conductive layer covering the light-emitting function layer 230 of each light-emitting device and the pixel definition layer 220, that is, the orthographic projection of the second electrode 240 on the pixel definition layer 220 covers each opening 221.

In some embodiments, the light-transmitting region 102 of the driving backplane 1 is provided with at least one light-converging layer, and the light-converging structure is an arc surface protrusion formed on the light-converging layer. In some embodiments, a region of at least one film layer of the plurality of film layers of the driving backplane 1, located in the region of the light-transmitting region 102 is the light-converging layer. The arc surface protrusions are formed on a side surface of the light-converging layer away from the substrate 100. The number of the arc surface protrusions may be one or more, and correspondingly, the number of the light-converging structures may also be one or more.

The surface of the arc surface protrusion can be a curved surface or an arc surface. For example, the cross section of the arc surface protrusion in the thickness direction of the driving backplane is an arc shape, and the arc shape can be in a parabolic shape, an oval shape, a circular arc shape and the like. In some embodiments, the surface of the arc surface protrusion is a spherical crown. Furthermore, the arc surface protrusion may be hemispherical. The hemispherical protrusion is easier to form during the process, and the light-converging effect of the hemispherical protrusion is convenient to control.

In some embodiments, in the plurality of film layers of the driving backplane 1, a region of at least one film layer located in the light-transmitting region 102 is a light-converging layer. An arc surface protrusion is formed on the light-converging layer. In some embodiments, a region of at least one film layer of the first gate insulation layer 120, the second gate insulation layer 140, the interlayer dielectric layer 150, the first planarization layer 170, and the second planarization layer 190, located in the light-transmitting region 102 is a light-converging layer. In these film layers, a region of one film layer located in the light-transmitting region 102 may be a light-converging layer, or, regions of two, three or more film layers located in the light-transmitting region 102 may be light-converging layers. For example, as shown in FIG. 1, in an embodiment, the region of the second planarization layer 190 located in the light-transmitting region 102 is a light-converging layer. As shown in FIG. 2, in another embodiment, the regions of the second planarization layer 190 and the first planarization layer 170 located in the light-transmitting region 102 are both light-converging layers. As shown in FIG. 3, in yet another embodiment, the regions of the second planarization layer 190, the first planarization layer 170, and the interlayer dielectric layer 150 located in the light-transmitting region 102 are all light-converging layers.

As shown in FIG. 2, in some embodiments of the present disclosure, the light-converging layer includes a first light-converging layer 111 and a second light-converging layer 112 distributed in a direction away from the substrate 100. That is, the light-transmitting region 102 of the driving backplane 1 is provided with two layers of light-converging layers, which are respectively a first light-converging layer 111 and a second light-converging layer 112. In the two layers, the one closer to the substrate 100 is the first light-converging layer 111, and the one farther away from the substrate 100 is the second light-converging layer 112. The first light-converging layer 111 and the second light-converging layer 112 are formed with arc surface protrusions.

The light-converging structure includes a first light-converging structure 1111 and a second light-converging structure 1121. The arc surface protrusion of the first light-converging layer 111 is the first light-converging structure 1111, and the arc surface protrusion of the second light-converging layer 112 is the second light-converging structure 1121. An orthographic projection of a part of the first light-converging structure 1111 on the substrate 100 does not coincide with an orthographic projection of the second light-converging structure 1121 on the substrate 100. That is, at least part of orthographic projections of the first light-converging structure 1111 and the second light-converging structure 1121 on the substrate 100 do not coincide with each other. In some embodiments, the number of arc surface protrusions of the first light-converging layer 111 is more than one, and correspondingly, the number of first light-converging structures 1111 is also more than one. The number of arc surface protrusions of the second light-converging layer 112 is more than one, correspondingly, the number of second light-converging structures 1121 is also more than one. A part of the first light-converging structures 1111 are located between two adjacent second light-converging structures 1121, so that more light converges when passing through the light-transmitting region 102.

In some embodiments, the region of the second planarization layer 190 located in the light-transmitting region 102 is the second light-converging layer 112, and the region of the first planarization layer 170 located in the light-transmitting region 102 is the first light-converging layer 111. The light enters the light-transmitting region 102 through the light-emitting layer 2, and is converged by the second planarization layer 190 and the first planarization layer 170.

Furthermore, the refractive index of the pixel definition layer 220 is less than the refractive index of the second planarization layer 190, and the refractive index of the second planarization layer 190 is less than the refractive index of the first planarization layer 170. When entering the high refractive index material from the low refractive index material, light is refracted. In this embodiment, a first refraction occurs when the light enters the second planarization layer 190 from the pixel definition layer 220, and then a second refraction occurs when the light enters the first planarization layer 170 through the second planarization layer 190. At the same time, when the light enters the second planarization layer 190 from the pixel definition layer 220, a first light converging is performed through the second light-converging structure 1121; and then, when the light enters the first planarization layer 170 through the second planarization layer 190, a second light converging is performed through the first light-converging structure 1111. Finally, the light enters the under-screen camera apparatus. In this process, the refraction helps to expend the range of light that can be received by the under-screen camera apparatus, and the light-converging structure can further converge the light, thus enhancing the brightness of the light received by the under-screen camera apparatus and improving the imaging quality. In some embodiments, the effect of the first refraction that occurs when the light enters the second planarization layer 190 from the pixel definition layer 220, is as shown in FIG. 6. The effect of the first light converging through the second light-converging structure 1121 when the light enters the second planarization layer 190 from the pixel definition layer 220, is as shown in FIG. 5 and FIG. 6. The refraction effect and light-converging effect of other film layers are similar to that in FIG. 5 and FIG. 6, and details are not described in detail here.

Furthermore, the refractive index of the first planarization layer 170 is less than or equal to the refractive index of the interlayer dielectric layer 150, the refractive index of the interlayer dielectric layer 150 is less than or equal to the refractive index of the second gate insulation layer 140, and the refractive index of the second gate insulation layer 140 is less than or equal to the refractive index of the first gate insulation layer 120, so as to ensure the light-converging effect of light. In some embodiments, the refractive index of the first planarization layer 170 is less than the refractive index of the interlayer dielectric layer 150, the refractive index of the interlayer dielectric layer 150 is less than the refractive index of the second gate insulation layer 140, and the refractive index of the second gate insulation layer 140 is less than the refractive index of the first gate insulation layer 120, so as to further enhance the refraction effect of light in the light-transmitting region 102, thus further expanding the range of light that can be received by the under-screen imaging apparatus.

In an embodiment, the refractive index of the pixel definition layer 220 is 1.0 to 1.4, the refractive index of the second planarization layer 190 is 1.5 to 1.9, and the refractive index of the first planarization layer 170 is 2.0 to 2.4.

Furthermore, the thickness of the second planarization layer 190 is greater than the thickness of the first planarization layer 170, so as to ensure that the second planarization layer 190 may cover the arc surface protrusions of the first planarization layer 170 located in the light-transmitting region 102. In a specific embodiment, the curvature radius of the second light-converging structure 1121 is greater than or equal to the curvature radius of the first light-converging structure 1111, that is, the curvature radius of the arc surface protrusion of the second light-converging layer 112 is greater than or equal to the curvature radius of the arc surface protrusion of the first light-converging layer 111. In this embodiment, the second light-converging structure 1121 having a greater curvature radius can receive more light, thus converging more light.

As shown in FIG. 3, in some embodiments of the present disclosure, the light-converging layer further includes a third light-converging layer 113. That is, the light-transmitting region 102 of the driving backplane 1 is provided with three light-converging layers, which are the first light-converging layer 111, the second light-converging layer 112, and the third light-converging layer 113 respectively. The third light-converging layer 113 is formed with an arc surface protrusion.

The light-converging structure further includes a third light-converging structure 1131. The arc surface protrusion of the third light-converging layer 113 is the third light-converging structure 1131. The region of the interlayer dielectric layer 150 located in the light-transmitting region 102 is the third light-converging layer 113. The refractive index of the first planarization layer 170 is less than the refractive index of the interlayer dielectric layer 150. In this embodiment, when the light enters the interlayer dielectric layer 150 from the first planarization layer 170, a third refraction occurs. At the same time, when the light enters the interlayer dielectric layer 150 from the first planarization layer 170, a third light converging is performed through the third light-converging structure 1131. Finally, the light enters the under-screen camera apparatus. In this embodiment, the number of times of light refraction is more, and the number of times of light converging is more, the range of the light that can be received by the under-screen camera apparatus is wider, and the brightness of the light that can be received is higher.

In some embodiments, the cross section of the arc surface protrusion in the thickness direction of the driving backplane 1 is an arc. The included angle between the tangent line of the lowest point of the arc and the connection line between the lowest point and the lowest point of the arc is not less than 45°.

As shown in FIG. 7, taking the third light-converging structure 1131 as an example, in a specific embodiment, the cross section of the third light-converging structure 1131 in the thickness direction of the driving backplane 1 is an arc. The tangent line of the lowest point of the arc forms an included angle $\alpha$ with the connection line between the lowest point and the lowest point of the arc, and the included angle $\alpha$ is not less than 45°.

Furthermore, the refractive index of the interlayer dielectric layer 150 is less than or equal to the refractive index of the second gate insulation layer 140, and the refractive index of the second gate insulation layer 140 is less than or equal to the refractive index of the first gate insulation layer 120, so as to ensure the light-converging effect. In some embodiments, the refractive index of the interlayer dielectric layer 150 is less than the refractive index of the second gate insulation layer 140, and the refractive index of the second gate insulation layer 140 is less than the refractive index of the first gate insulation layer 120, so as to further enhance the refraction effect of light in the light-transmitting region 102, thus further expanding the range of light that can be received by the under-screen camera apparatus.

Furthermore, an orthographic projection of a part of the third light-converging structures 1131 on the substrate 100 does not coincide with an orthographic projection of the first light-converging structure 1111 on the substrate 100. In some embodiments, the number of arc surface protrusions of the first light-converging layer 111 is more than one, and correspondingly, the number of first light-converging structures 1111 is also more than one. The number of arc surface protrusions of the third light-converging layer is more than one, and correspondingly, the number of third light-converging structures 1131 is also more than one. A part of the third light-converging structures 1131 are located between two adjacent first light-converging structures 1111, so that more light converges when passing through the light-transmitting region 102.

Furthermore, the thickness of the second planarization layer 190 is greater than the thickness of the first planarization layer 170, and the thickness of the first planarization layer 170 is greater than the thickness of the interlayer dielectric layer 150, so as to ensure that the second planarization layer 190 may cover the arc surface protrusion of the first planarization layer 170 located in the light-transmitting region 102, and the first planarization layer 170 may cover the arc surface protrusion of the interlayer dielectric layer 150 located in the light-transmitting region 102. In a specific embodiment, the curvature radius of the second light-converging structure 1121 is greater than or equal to the curvature radius of the first light-converging structure 1111, and the curvature radius of the first light-converging structure 1111 is greater than or equal to the curvature radius of the third light-converging structure 1131. In this embodiment, the curvature radius of the third light-converging structure 1131 is smaller, and the thickness of the interlayer dielectric layer 150 can be reduced to a certain extent, thus reducing the thickness of the driving backplane 1.

In some embodiments, the thickness of the second planarization layer 190 is 2.0 to 2.5 μm, the thickness of the first planarization layer 170 is 1.5 to 2.0 μm, and the thickness of the interlayer dielectric layer 150 is 1.0 to 1.5 μm. The curvature radius of the second light-converging structure 1121 is 4.0 to 6.0 μm, the curvature radius of the first light-converging structure 1111 is 2.0 to 3.0 μm, and the curvature radius of the third light-converging structure 1131 is 1.0 to 1.5 μm.

As shown in FIG. 4, in some other embodiments of the present disclosure, there are a plurality of light-converging layers, and the plurality of light-converging layers are arranged and distributed in a direction away from the substrate 100. In two adjacent light-converging layers, one arc surface protrusion of the light-converging layer away from the substrate 100 covers a plurality of arc surface protrusions of the light-converging layer close to the substrate 100. That is, in the two adjacent light-converging layers, the orthographic projection of the arc surface protrusion of the light-converging layer away from the substrate 100 on the substrate 100 completely covers the orthographic projection of the arc surface protrusion of the light-converging layer close to the substrate 100 on the substrate 100.

Continued as shown in FIG. 4, furthermore, the light-converging layer includes a first light-converging layer 111 and a second light-converging layer 112 distributed in a direction away from the substrate 100. That is, the light-transmitting region 102 of the driving backplane 1 is provided with two light-converging layers, which are the first light-converging layer 111 and the second light-converging layer 112 respectively. In the two light-converging layers, the one closer to the substrate 100 is the first light-converging layer 111, and the one farther away from the substrate 100 is the second light-converging layer 112. The first light-converging layer 111 and the second light-converging layer 112 are formed with arc surface protrusions.

The light-converging structure includes a first light-converging structure 1111 and a second light-converging structure 1121. The arc surface protrusion of the first light-converging layer 111 is the first light-converging structure 1111, the arc surface protrusion of the second light-converging layer 112 is the second light-converging structure 1121. An orthographic projection of the second light-converging structure 1121 on the substrate 100 completely covers an orthographic projection of the first light-converging structure 1111 on the substrate 100. In an embodiment, the number of arc surface protrusions of the second light-converging layer 112 is one or more, the number of arc surface protrusions of the first light-converging layer 111 is more than one, and correspondingly, the number of the second light-converging structures 1121 is one or more, and the number of the first light-converging structures 1111 is more than one. Among them, a single second light-converging structure 1121 at least covers two first light-converging structures 1111. In this embodiment, it can be ensured that light in a larger range can be converged.

In a specific embodiment, a region of the second planarization layer 190 located in the light-transmitting region 102 is the second light-converging layer 112, and a region of the first planarization layer 170 located in the light-transmitting region 102 is the first light-converging layer 111.

Furthermore, the light-converging layer further includes a third light-converging layer 113. That is, the light-transmitting region 102 of the driving backplane 1 is provided with a three light-converging layers, which are the first light-converging layer 111, the second light-converging layer 112 and the third light-converging layer 113 respectively. The third light-converging layer 113 is formed with an arc surface protrusion.

The light-converging structure includes a third light-converging structure 1131, and the arc surface protrusion of third light-converging layer 113 is third light-converging structure 1131. An orthographic projection of the first light-converging structure 1111 on the substrate 100 completely covers an orthographic projection of the third light-converging structure 1131 on the substrate 100. In a specific embodiment, the number of arc surface protrusions of the third light-converging layer 113 is more than one, and correspondingly, the number of third light-converging structures 1131 is more than one. Among them, a single first light-converging structure 1111 at least covers the two third light-converging structures 1131.

As shown in FIG. 8, the present disclosure further provides a method for manufacturing a display panel, and the structure of the display panel may refer to the embodiments of the above display panel, which is not described in detail here. The method for manufacturing the display panel includes the following steps.

In step S100, a driving backplane 1 is formed, the driving backplane 1 is provided with a pixel region 101 and a light-transmitting region 102, and the light-transmitting region 102 is provided with a plurality of light-converging structures;

In step S200, a light-emitting layer 2 is formed on a side of the driving backplane 1, the light-emitting layer 2 covers the pixel region 101 and the light-transmitting region 102, the light-emitting layer 2 includes a plurality of light-emitting devices, and each light-emitting device is located within the pixel region 101;

Among them, the light-converging structures are used to enable light entering the light-transmitting region 102 through the light-emitting layer 2 to be converged and emitted towards the side of the light-transmitting region 102 away from the light-emitting layer 2.

Furthermore, the light-transmitting region 102 is provided with at least one light-converging layer, an arc surface protrusion is formed on the light-converging layer, and the light-converging structure is the arc surface protrusion.

As shown in FIG. 9 to FIG. 11, and FIG. 3, furthermore, in combination with the structure of the driving backplane 1, step S100 includes the following.

In step S100, a substrate 100 is provided;

In step S100, an active layer 110 is formed on a side of the substrate 100, and the active layer 110 is located within the pixel region 101;

In step S110, a first gate insulation layer 120 is formed on a side of the active layer 110 away from the substrate 100, and the first gate insulation layer 120 covers the active layer 110 and the substrate 100;

In step S120, a gate layer 130 is formed on a side of the first gate insulation layer 120 away from the substrate 100, and the gate layer 130 is provided directly opposite to the active layer 110;

In step S130, a second gate insulation layer 140 is formed on a side of the gate layer 130 away from the substrate 100, and the second gate insulation layer 140 covers the gate layer 130 and the first gate insulation layer 120;

In step S140, an interlayer dielectric layer 150 is formed on a side of the second gate insulation layer 140 away from the substrate 100, and the interlayer dielectric layer 150 covers the second gate insulation layer 140;

In step S150, a first source/drain layer 160 is formed on a side of the interlayer dielectric layer 150 away from the substrate 100, and the first source/drain layer 160 is connected to the active layer 110;

In step S160, a first planarization layer 170 is formed on a side of the first source/drain layer 160 away from the substrate 100, and the first planarization layer 170 covers the first source/drain layer 160 and the interlayer dielectric layer 150;

In step S170, a second source/drain layer 180 is formed on a side of the first planarization layer 170 away from the substrate 100, and the second source/drain layer 180 is connected to the first source/drain layer 160;

In step S180, a second planarization layer 190 is formed on a side of the second source/drain layer 180 away from the substrate 100, and the second planarization layer 190 covers the second source/drain layer 180 and the first planarization layer 170;

Among them, a region of at least one film layer of the first gate insulation layer 120, the second gate insulation layer 140, the interlayer dielectric layer 150, the first planarization layer 170, and the second planarization layer 190, located in the light-transmitting region 102 is the light-converging layer. In some embodiments, the region of the first gate insulation layer 120, the second gate insulation layer 140, the interlayer dielectric layer 150, the first planarization layer 170, or the second planarization layer 190, located in the light-transmitting region 102 can form the light-converging layer with the arc surface protrusion by exposure and development.

The details of each step of the manufacturing method according to the present disclosure can be referred to the embodiments of the display panel. As shown in FIG. 9, after the interlayer dielectric layer 150 is formed on the side of the second gate insulation layer 140 away from the substrate 100, exposure and development are performed on the interlayer dielectric layer 150, so that the region of the interlayer dielectric layer 150 located in the light-transmitting region 102 forms the third light-converging structure 1131. Similarly, as shown in FIG. 10, after the first planarization layer 170 is formed on the side of the first source/drain layer 160 away from the substrate 100, exposure and development are performed on the planarization layer 170, so that the region of the planarization layer 170 located in the light-transmitting region 102 forms the first light-converging structure 1111. As shown in FIG. 11, after the second planarization layer 190 is formed on the side of the second source/drain layer 180 away from the substrate 100, exposure and development are performed on the second planarization layer 190, so that the region of the second planarization layer 190 located in the light-transmitting region 102 forms the second light-converging structure 1121. And then, the remaining steps are performed to finally form the display panel as shown in FIG. 3.

The present disclosure further provides a display apparatus, including the display panel according to any one of the above embodiments.

As shown in FIG. 12, the present disclosure further provides a terminal device, including the above-mentioned display apparatus and a camera apparatus 3. The camera apparatus 3 is provided on a side of the driving backplane 1 away from the light-emitting layer 2, and is opposite to the light-transmitting region 102.

It should be noted that, although the various steps of the method in the present disclosure are described in a specific order in the drawings, however, this does not require or imply that these steps must be performed in the specific order, or that all the illustrated steps must be performed to achieve the desired results. Additionally or alternatively, some steps may be omitted, more than one step may be combined into one step for execution, and/or one step may be decomposed into more than one step for execution, etc.

Other embodiments of the present disclosure will be apparent to those skilled in the art from consideration of the specification and practice of the invention disclosed here. The present application is intended to cover any variations, uses, or adaptations of the present disclosure following the general principles of the present disclosure and including common general knowledge or conventional technical means in the art not disclosed in the present disclosure. The specification and embodiments are only considered exemplary, and the true scope and spirit of the disclosure are indicated by the appended claims.

What is claimed is:

1. A display panel, comprising:

a driving backplane, provided with a pixel region and a light-transmitting region, the light-transmitting region being provided with a plurality of light-converging structures; and a light-emitting layer, provided on a side of the driving backplane and covering the pixel region and the light-transmitting region, the light-emitting layer comprising a plurality of light-emitting devices, and a light-emitting device being located within the pixel region;

wherein a light-converging structure is used to enable light entering the light-transmitting region through the light-emitting layer to be converged and emitted towards a side of the light-transmitting region away from the light-emitting layer;

wherein the driving backplane comprises:

a substrate;

an active layer, provided on a side of the substrate and located in the pixel region;

a first gate insulation layer, covering the active layer and the substrate;

a gate layer, provided on a side of the first gate insulation layer away from the substrate, and provided directly opposite to the active layer;

a second gate insulation layer, covering the gate layer and the first gate insulation layer;

an interlayer dielectric layer, covering the second gate insulation layer;

a first source/drain layer, provided on a side of the interlayer dielectric layer away from the substrate, the first source/drain layer being connected to the active layer;

a first planarization layer, covering the first source/drain layer and the interlayer dielectric layer;

a second source/drain layer, provided on a side of the first planarization layer away from the substrate, the second source/drain layer being connected to the first source/drain layer; and a second planarization layer, covering the second source/drain layer and the first planarization layer;

wherein the light-transmitting region is provided with a first light-converging layer and a second light-converging layer distributed towards a direction away from the substrate;

wherein the light-emitting layer comprises:

a first electrode, provided on a surface of the second planarization layer away from the substrate;

a pixel definition layer, provided on a surface of the second planarization layer away from the substrate and exposing the first electrode;

a light-emitting function layer, at least covering a surface region of the first electrode away from the substrate and exposed by the pixel definition layer; and a second electrode, covering the light-emitting function layer;

wherein a region of the second planarization layer located in the light-transmitting region is the second light-converging layer, a region of the first planarization layer located in the light-transmitting region is the first light-converging layer, a refractive index of the pixel definition layer is less than a refractive index of the second planarization layer, and the refractive index of the second planarization layer is less than a refractive index of the first planarization layer.

2. The display panel according to claim 1, wherein and the light-converging structure is an arc surface protrusion formed on a light-converging layer.

3. The display panel according to claim 2, wherein the light-emitting layer is provided on a surface of the second planarization layer away from the substrate;

wherein, a region of at least one film layer of the first gate insulation layer, the second gate insulation layer, the interlayer dielectric layer, the first planarization layer, and the second planarization layer, located in the light-transmitting region is the light-converging layer.

4. The display panel according to claim 3, wherein
the light-converging structure comprises a first light-converging structure and a second light-converging structure;
an arc surface protrusion of the first light-converging layer is the first light-converging structure, and an arc surface protrusion of the second light-converging layer is the second light-converging structure; and
an orthographic projection of a part of the first light-converging structure on the substrate does not coincide with an orthographic projection of the second light-converging structure on the substrate.

5. The display panel according to claim 3, wherein the refractive index of the pixel definition layer is 1.0 to 1.4, the refractive index of the second planarization layer is 1.5 to 1.9, and the refractive index of the first planarization layer is 2.0 to 2.4; and
a thickness of the second planarization layer is greater than a thickness of the first planarization layer, and a curvature radius of the second light-converging structure is greater than or equal to a curvature radius of the first light-converging structure.

6. The display panel according to claim 3, wherein the light-converging layer further comprises a third light-converging layer;
the light-converging structure further comprises a third light-converging structure, and an arc surface protrusion of the third light-converging layer is the third light-converging structure; and
a region of the interlayer dielectric layer located in the light-transmitting region is the third light-converging layer, and the refractive index of the first planarization layer is less than a refractive index of the interlayer dielectric layer.

7. The display panel according to claim 6, wherein the refractive index of the interlayer dielectric layer is less than or equal to a refractive index of the second gate insulation layer, and the refractive index of the second gate insulation layer is less than or equal to a refractive index of the first gate insulation layer.

8. The display panel according to claim 7, wherein an orthographic projection of a part of the third light-converging structure on the substrate does not coincide with an orthographic projection of the first light-converging structure on the substrate.

9. The display panel according to claim 7, wherein a thickness of the second planarization layer is greater than a thickness of the first planarization layer, and the thickness of the first planarization layer is greater than a thickness of the interlayer dielectric layer; a curvature radius of the second light-converging structure is greater than or equal to a curvature radius of the first light-converging structure, and the curvature radius of the first light-converging structure is greater than or equal to a curvature radius of the third light-converging structure.

10. The display panel according to claim 7, wherein a curvature radius of the second light-converging structure is 4.0 to 6.0 μm, a curvature radius of the first light-converging structure is 2.0 to 3.0 μm, and a curvature radius of the third light-converging structure is 1.0 to 1.5 μm.

11. The display panel according to claim 3, wherein a number of the light-converging layer is more than one, and a plurality of light-converging layers are arranged and distributed towards a direction away from the substrate; and
in two adjacent light-converging layers, an arc surface protrusion of a light-converging layer away from the substrate covers a plurality of arc surface protrusions of a light-converging layer close to the substrate.

12. The display panel according to claim 11, wherein the light-converging layer comprises a first light-converging layer and a second light-converging layer distributed towards a direction away from the substrate;
the light-converging structure comprises a first light-converging structure and a second light-converging structure;
an arc surface protrusion of the first light-converging layer is the first light-converging structure, and an arc surface protrusion of the second light-converging layer is the second light-converging structure; and
an orthographic projection of the second light-converging structure on the substrate completely covers an orthographic projection of the first light-converging structure on the substrate.

13. The display panel according to claim 12, wherein the light-converging layer further comprises a third light-converging layer, and the third light-converging layer is located on a side of the first light-converging layer close to the substrate;
the light-converging structure further comprises a third light-converging structure;
an arc surface protrusion of the third light-converging layer is the third light-converging structure; and
the orthographic projection of the first light-converging structure on the substrate completely covers an orthographic projection of the third light-converging structure on the substrate.

14. The display panel according to claim 2, wherein a cross section of the arc surface protrusion in a thickness direction of the driving backplane is an arc, and an included angle between a tangent line of a lowest point of the arc and a connection line between the lowest point and another lowest point of the arc is not less than 45°; and
a surface of the arc surface protrusion is a spherical crown.

15. A method for manufacturing a display panel, comprising:
forming a driving backplane, the driving backplane being provided with a pixel region and a light-transmitting region, and the light-transmitting region being provided with a plurality of light-converging structures;
forming a light-emitting layer on a side of the driving backplane, the light-emitting layer covering the pixel region and the light-transmitting region, the light-emitting layer comprising a plurality of light-emitting devices, and each light-emitting device being located within the pixel region;

wherein a light-converging structure is used to enable light entering the light-transmitting region through the light-emitting layer to be converged and emitted towards a side of the light-transmitting region away from the light-emitting layer;

forming the driving backplane comprises:

providing a substrate;

forming an active layer on a side of the substrate, the active layer being located within the pixel region;

forming a first gate insulation layer on a side of the active layer away from the substrate, the first gate insulation layer covering the active layer and the substrate;

forming a gate layer on a side of the first gate insulation layer away from the substrate, the gate layer being provided directly opposite to the active layer;

forming a second gate insulation layer on a side of the gate layer away from the substrate, the second gate insulation layer covering the gate layer and the first gate insulation layer;

forming an interlayer dielectric layer on a side of the second gate insulation layer away from the substrate, the interlayer dielectric layer covering the second gate insulation layer;

forming a first source/drain layer on a side of the interlayer dielectric layer away from the substrate, the first source/drain layer being connected to the active layer;

forming a first planarization layer on a side of the first source/drain layer away from the substrate, the first planarization layer covering the first source/drain layer and the interlayer dielectric layer;

forming a second source/drain layer on a side of the first planarization layer away from the substrate, the second source/drain layer being connected to the first source/drain layer; and forming a second planarization layer on a side of the second source/drain layer away from the substrate, the second planarization layer covering the second source/drain layer and the first planarization layer;

wherein the light-transmitting region is provided with a first light-converging layer and a second light-converging layer distributed towards a direction away from the substrate;

wherein the light-emitting layer comprises:

a first electrode, provided on a surface of the second planarization layer away from the substrate;

a pixel definition layer, provided on a surface of the second planarization layer away from the substrate and exposing the first electrode;

a light-emitting function layer, at least covering a surface region of the first electrode away from the substrate and exposed by the pixel definition layer; and a second electrode, covering the light-emitting function layer;

wherein a region of the second planarization layer located in the light-transmitting region is the second light-converging layer, a region of the first planarization layer located in the light-transmitting region is the first light-converging layer, a refractive index of the pixel definition layer is less than a refractive index of the second planarization layer, and the refractive index of the second planarization layer is less than a refractive index of the first planarization layer.

16. The method for manufacturing the display panel according to claim 15, wherein an arc surface protrusion is formed on a light-converging layer, and the light-converging structure is the arc surface protrusion.

17. A display apparatus, comprising a display panel, wherein the display panel comprises:

a driving backplane, provided with a pixel region and a light-transmitting region, the light-transmitting region being provided with a plurality of light-converging structures; and a light-emitting layer, provided on a side of the driving backplane and covering the pixel region and the light-transmitting region, the light-emitting layer comprising a plurality of light-emitting devices, and a light-emitting device being located within the pixel region;

wherein a light-converging structure is used to enable light entering the light-transmitting region through the light-emitting layer to be converged and emitted towards a side of the light-transmitting region away from the light-emitting layer;

wherein the driving backplane comprises:

a substrate;

an active layer, provided on a side of the substrate and located in the pixel region;

a first gate insulation layer, covering the active layer and the substrate;

a gate layer, provided on a side of the first gate insulation layer away from the substrate, and provided directly opposite to the active layer;

a second gate insulation layer, covering the gate layer and the first gate insulation layer;

an interlayer dielectric layer, covering the second gate insulation layer;

a first source/drain layer, provided on a side of the interlayer dielectric layer away from the substrate, the first source/drain layer being connected to the active layer;

a first planarization layer, covering the first source/drain layer and the interlayer dielectric layer;

a second source/drain layer, provided on a side of the first planarization layer away from the substrate, the second source/drain layer being connected to the first source/drain layer; and a second planarization layer, covering the second source/drain layer and the first planarization layer;

wherein the light-transmitting region is provided with a first light-converging layer and a second light-converging layer distributed towards a direction away from the substrate;

wherein the light-emitting layer comprises:

a first electrode, provided on a surface of the second planarization layer away from the substrate;

a pixel definition layer, provided on a surface of the second planarization layer away from the substrate and exposing the first electrode;

a light-emitting function layer, at least covering a surface region of the first electrode away from the substrate and exposed by the pixel definition layer; and a second electrode, covering the light-emitting function layer;

wherein a region of the second planarization layer located in the light-transmitting region is the second light-converging layer, a region of the first planarization layer located in the light-transmitting region is the first light-converging layer, a refractive index of the pixel definition layer is less than a refractive index of the second planarization layer, and the refractive index of the second planarization layer is less than a refractive index of the first planarization layer.

* * * * *